United States Patent
Arrigoni et al.

(10) Patent No.: US 9,698,087 B2
(45) Date of Patent: Jul. 4, 2017

(54) SEMICONDUCTOR DEVICE, CORRESPONDING METHODS OF PRODUCTION AND USE AND CORRESPONDING APPARATUS

(71) Applicant: STMicroelectronics S.r.l., Agrate Brianza (IT)

(72) Inventors: Alberto Arrigoni, Eupilio (IT); Alberto Da Dalt, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 14 days.

(21) Appl. No.: 15/161,617

(22) Filed: May 23, 2016

(65) Prior Publication Data
US 2017/0141019 A1  May 18, 2017

(30) Foreign Application Priority Data
Nov. 18, 2015 (IT) ........................ 102015000073934

(51) Int. Cl.
*H01L 23/495* (2006.01)
*H01L 23/31* (2006.01)
(Continued)

(52) U.S. Cl.
CPC .... *H01L 23/49575* (2013.01); *H01L 21/4853* (2013.01); *H01L 21/565* (2013.01);
(Continued)

(58) Field of Classification Search
CPC ..... H01L 2924/181; H01L 2924/19105; H01L 2224/49171; H01L 2224/30183; H01L 2224/48106; H01L 2224/48108; H01L 23/3107; H01L 23/49575; H01L 23/49541; H01L 23/49537; H01L 23/49503; H01L 23/49551; H01L 23/495; H01L 23/49861; H01L 23/49558; H01L 23/49586; H01L 23/3675; H01L 23/3114; H01L 33/62;
(Continued)

(56) References Cited

U.S. PATENT DOCUMENTS 5,237,485 A   8/1993  Cognetti de Martiis et al.
5,587,883 A * 12/1996  Olson ................. H01L 23/4334
                                                        174/529
(Continued)

FOREIGN PATENT DOCUMENTS

JP    2015060876 A    3/2015
WO    WO-03105223 A2  12/2003

OTHER PUBLICATIONS

IT Search Report and Written Opinion for IT 102015000073934 dated Jul. 4, 2016 (9 pages).

*Primary Examiner* — Cory Eskridge
(74) *Attorney, Agent, or Firm* — Gardere Wynne Sewell LLP

(57) ABSTRACT

A semiconductor device includes a quadrilateral package with a first pair of opposed sides and a second pair of opposed sides. Both sides of the first pair of opposed sides are provided with electrical contact leads. Only one side of the second pair of opposed sides is provided with electrical contact leads. The side of the second pair of opposed sides without electrical contact leads is a leadless side. That side is not a molded side of the package, but rather is defined by a cut surface.

13 Claims, 3 Drawing Sheets

(51) Int. Cl.
*H01L 21/78* (2006.01)
*H01L 21/56* (2006.01)
*H01L 21/48* (2006.01)

(52) U.S. Cl.
CPC .......... *H01L 21/78* (2013.01); *H01L 23/3114* (2013.01); *H01L 23/49503* (2013.01); *H01L 23/49541* (2013.01)

(58) Field of Classification Search
CPC ....... H01L 33/54; H01L 33/642; H01L 21/78; H01L 21/4853; H01L 21/565; H01L 2933/0033; H01L 2933/0066; H05K 2201/10924; H05K 3/308; H05K 3/3426
USPC ........................................................ 257/666
See application file for complete search history.

(56) References Cited

U.S. PATENT DOCUMENTS

| | | |
|---|---|---|
| 7,256,479 B2 | 8/2007 | Noquil et al. |
| 7,996,987 B2 | 8/2011 | Diab et al. |
| 8,163,601 B2 | 4/2012 | Gong et al. |
| 2011/0244629 A1 | 10/2011 | Gong et al. |
| 2011/0284495 A1 | 11/2011 | Li et al. |
| 2012/0238056 A1 | 9/2012 | Numazaki |
| 2014/0084435 A1 | 3/2014 | Kimura |
| 2014/0196938 A1 | 7/2014 | Ishibashi |
| 2015/0021749 A1* | 1/2015 | Ohashi .................... H01L 24/06 257/666 |

* cited by examiner

SEMICONDUCTOR DEVICE, CORRESPONDING METHODS OF PRODUCTION AND USE AND CORRESPONDING APPARATUS

PRIORITY CLAIM

This application claims priority from Italian Application for Patent No. 102015000073934 filed Nov. 18, 2015, the disclosure of which is incorporated by reference.

TECHNICAL FIELD

The description relates to semiconductor devices.

One or more embodiments may apply e.g. to integrated circuits (ICs).

BACKGROUND

Various applications of semiconductor devices such as e.g. integrated circuits (ICs) may involve using Quad Flat Packages (QFP's).

Such packages may include electrical contact leads at each of the four sides of the quadrilateral package.

Nowadays, various electronic systems e.g. in the automotive field may be available in different versions e.g. covering a range from low electronics content vehicles to premium vehicles, without relevant differences, other than e.g. the number of interfaces or the computational power level.

For instance, different platforms for a same application (e.g. passenger vehicle airbag systems) may be managed with different package sizes and different package layouts.

Also, these platforms may involve e.g. a dedicated external connectivity utility (ECU), with consequent package and ECU cost increase, due to their different targets, e.g. to address either low or high electronics content.

Certain solutions may involve using concentric footprints, suitable for different package body sizes.

This may facilitate ECU standardization and cost saving, to the detriment of flexibility in routing signals to the mounting substrate (e.g. a printed circuit board—PCB) and electro-magnetic compatibility—EMC performance.

Even these solutions may not exempt final customers from adopting dedicated ECUs for each platform for a same application, with each ECU designed with dedicated packages combination and different footprints.

On the other hand, final customers may be faced with the need of reducing the number of different ECUs to cover various types of vehicles and the PCB space used by each IC footprint.

SUMMARY

According to one or more embodiments, a semiconductor device is provided.

One or more embodiments may also relate to methods of producing and using such a device as well as to corresponding apparatus for use e.g. in the automotive field (just to make a non-limiting example: in a passenger vehicle airbag system).

One or more embodiments may provide a package having one side with no leads (lead-less).

In one or more embodiments, such a package may be obtained by halfway cutting e.g. laser-cutting what may be otherwise regarded as a standard package, so that two "half-packages" (possibly equal to each other) may be obtained from what may otherwise be seen as a single standard QFP.

One or more embodiments may dispense with the need for a dedicated line, thus making it possible to use existing assembly lines with reduced investments related to the cutting e.g. laser equipment Additional advantages provided by one or more embodiments may include: improved utilization/saturation of assembly lines, cost reduction in package assembly, reduction of the various material involved, and reduction in machine setup time.

In an embodiment, a semiconductor device comprises: a quadrilateral package including a first side and a second side, wherein the first and second sides are opposed sides and are both provided with electrical contact leads and further including a third side and a fourth side, wherein the third and fourth sides are opposed sides and wherein the third side is provided with electrical contact leads, and wherein the fourth side is a leadless side, and wherein said first through third sides are molded sides of the quadrilateral package and said fourth side is a non-molded side of the quadrilateral package defined by a cut surface.

In an embodiment, a semiconductor device comprises: a leadframe including a first die pad and a second die pad, said first and second die pads connected by bridge connector portions at opposite ends of a longitudinally extending intermediate gap; a first integrated circuit chip mounted to the first die pad; a second integrated circuit chip mounted to the second die pad; a quadrilateral package encapsulating the leadframe, first integrated circuit chip and second integrated circuit chip and including a first side and a second side, wherein the first and second sides are opposed sides, said first side including first electrical contact leads coupled to the first integrated circuit chip and second electrical contact leads coupled to the second integrated circuit chip, said second side including third electrical contact leads coupled to the first integrated circuit chip and fourth electrical contact leads coupled to the second integrated circuit chip, and further including a third side and a fourth side, wherein the third and fourth sides are opposed sides, said third side including fifth electrical contact leads coupled to the first integrated circuit chip said fourth side including sixth electrical contact leads coupled to the second integrated circuit chip; wherein said longitudinally extending intermediate gap is configured to support cutting of the quadrilateral package into first and second half packages with the first half package including the first die pad, first integrated circuit chip and the first, third and fifth electrical contact leads and the second half package including the second die pad, second integrated circuit chip and the second, fourth and sixth electrical contact leads.

In an embodiment, a method of producing semiconductor devices comprises: providing a quadrilateral lead frame including first and second lead frame portions having an intermediate plane therebetween, wherein said first and second lead frame portions include respective die pad islands, wherein sets of electrical contact leads are provided on all sides of said quadrilateral lead frame, arranging first and second semiconductor dice on said respective die pad islands of said first and second lead frame portions, molding a package onto said quadrilateral lead frame having said first and second semiconductor dice arranged thereon, and cutting said quadrilateral lead frame having said first and second semiconductor dice arranged thereon and said package molded thereon along said intermediate plane, thereby producing a pair of semiconductor devices separated at said intermediate plane.

In an embodiment, a method comprises: mounting a semiconductor device to a mounting substrate provided with at least one quadrilateral external connection utility having electrical contact formations on all sides of said quadrilateral external connection utility, wherein said semiconductor device comprises a quadrilateral package including a first side and a second side, wherein the first and second sides are opposed sides and are both provided with electrical contact leads and further including a third side and a fourth side, wherein the third and fourth sides are opposed sides and wherein the third side is provided with electrical contact leads, and wherein the fourth side is a leadless side, and wherein said first through third sides are molded sides of the quadrilateral package and said fourth side is a non-molded side of the quadrilateral package defined by a cut surface, connecting said semiconductor device to said at least one quadrilateral external connection utility with the electrical contact leads of said third side in electrical contact with the electrical contact formations on one side of said at least one external connection utility, and the electrical contact leads of the first and second sides in electrical contact with electrical contact formations provided on two other sides of said at least one external connection utility.

In an embodiment, an electronic apparatus comprises: a mounting substrate including at least one quadrilateral external connection utility having electrical contact formations on all sides of said external connection utility, a semiconductor device mounted to the mounting substrate, said semiconductor device comprising a quadrilateral package including a first side and a second side, wherein the first and second sides are opposed sides and are both provided with electrical contact leads and further including a third side and a fourth side, wherein the third and fourth sides are opposed sides and wherein the third side is provided with electrical contact leads, and wherein the fourth side is a leadless side, and wherein said first through third sides are molded sides of the quadrilateral package and said fourth side is a non-molded side of the quadrilateral package defined by a cut surface, wherein the semiconductor device is connected to said at least one quadrilateral external connection utility with the electrical contact leads of said third side in electrical contact with the electrical contact formations on one side of said at least one external connection utility, and the electrical contact leads of the first and second sides in electrical contact with electrical contact formations provided on two other sides of said at least one external connection utility.

BRIEF DESCRIPTION OF THE DRAWINGS

One or more embodiments will now be described, by way of example only, with reference to the annexed figures, wherein.

It will be appreciated that for the sake of simplicity of representation the various figures may not be drawn to a same scale.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Semiconductor devices such as e.g. integrated circuits are an extensive area of technology, involving various types of substrates, devices and apparatus.

Documents such as U.S. Pat. Nos. 5,237,485 A, 7,256,479 B2 and 7,996,987 B2 (all incorporated by reference) are exemplary of the related art. For instance, U.S. Pat. No. 7,996,987 B2 discloses a system and method for producing a family of power modules having a common footprint that enables the customer to flexibly choose a power module size without incurring the costs of a re-layout of a system design.

Figure 1:
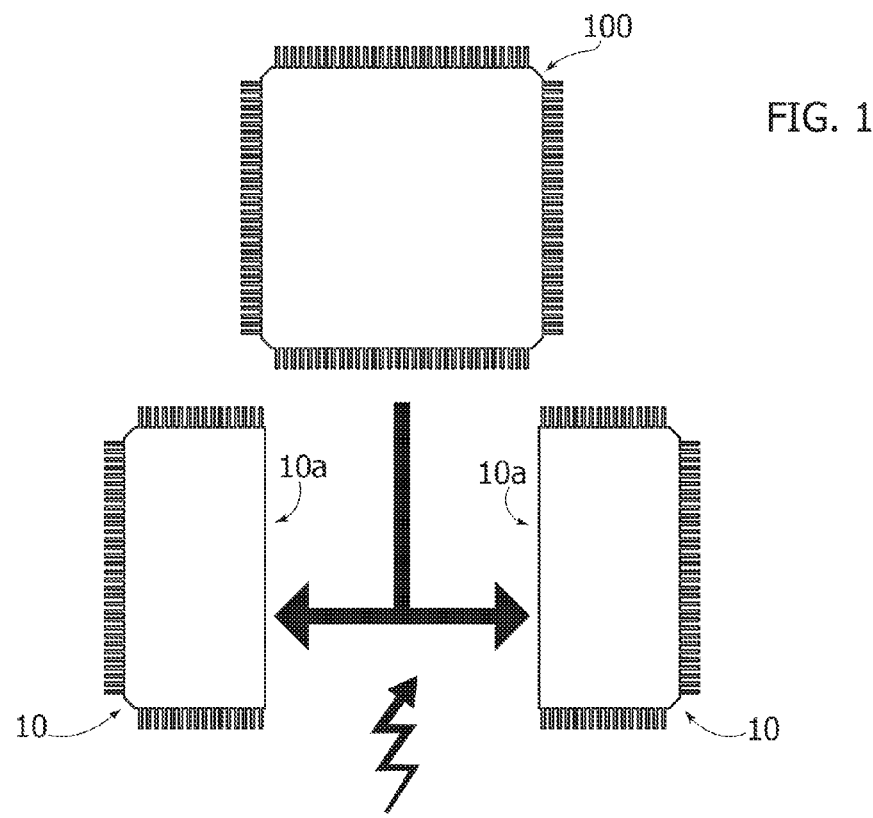
FIG. 1, is exemplary of a general concept of a package for a semiconductor device.

Reference is now made to FIG. 1. One or more embodiments involve a package 10 for a semiconductor device (e.g. an integrated circuit) having one side 10a with no leads (lead-less), the package 10 having otherwise a conventional structure.

One or more embodiments, such a "half flat package"— HFP may be produced by cutting e.g. halfway what may be otherwise regarded as a standard quadrilateral (e.g. square or rectangular) package 100 e.g. QFP—see e.g. FIG. 1, thus producing a "leadless" side exempt from electrical contact leads, such leadless side including a cut surface resulting from cutting the package.

Laser cutting LC is a technology suitable for such cutting according to one or more embodiments.

In that way, two different "half" packages 10 (possibly equal to each other) may be obtained from a single standard package e.g. QFP 100.

Figure 2:
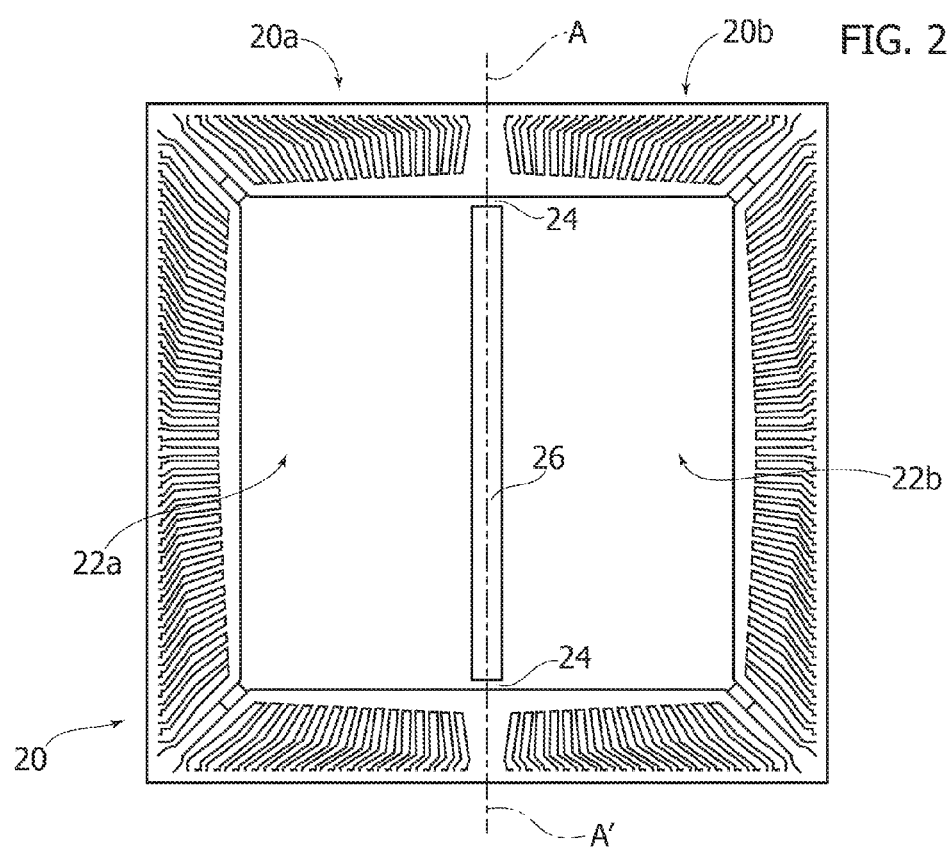
FIGS. 2 to 4 are exemplary of steps a method for manufacture.

FIG. 2 is exemplary of a design of a lead frame (LF) 20. Standard lead frame manufacturing processes (etching or stamping) and electrically conductive materials (e.g. copper) can be used without any modifications for producing such a lead frame 20.

In one or more embodiments, such a lead frame may include two portions 20a, 20b, arranged (e.g. mirror-symmetrical) on opposed sides with respect to a central plane A-A' (or axis, given the overall planarity of the lead frame 20 and the final semiconductor device package produced thereby).

In one or more embodiments, the two portions 20a, 20b may include respective die pad islands or lands 22a, 22b.

In one or more embodiments, the two portions 20a, 20b may be mechanically linked to each other (e.g. at the die pad islands 22a, 22b) by means of e.g. bridge-like connection formations 24 extending across an intermediate gap 26 between the die pad islands 22a, 22b co-extensive with the axis A-A'.

In one or more embodiments, the connection formations 24 (e.g. two formations joining opposed ends of the die pads 22a, 22b) may provide stability and rigidity of the lead frame structure.

Figure 3:
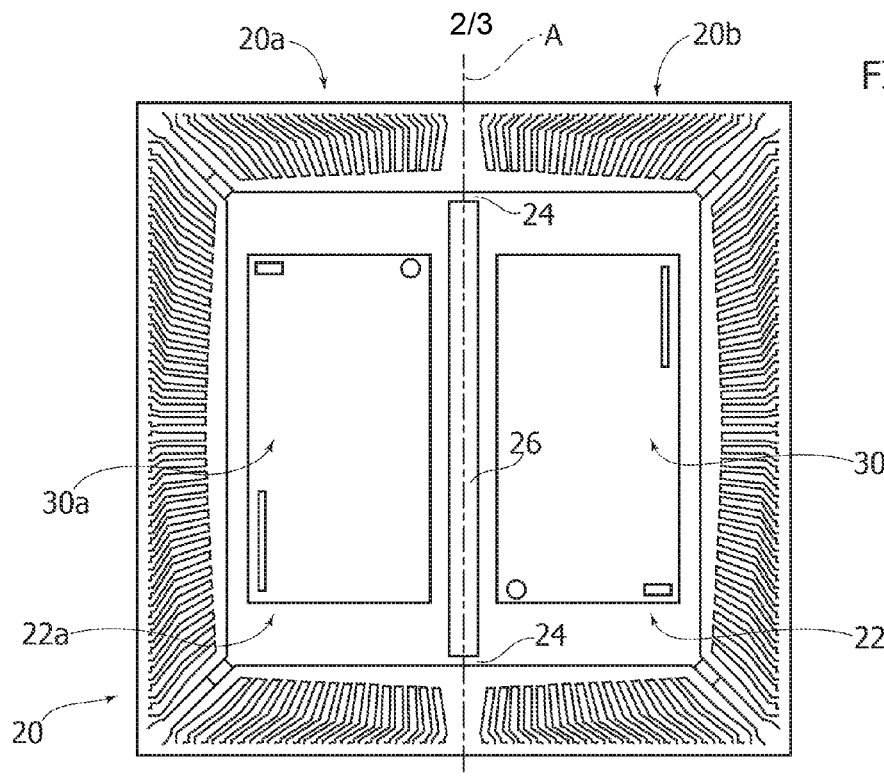
Figure 4:
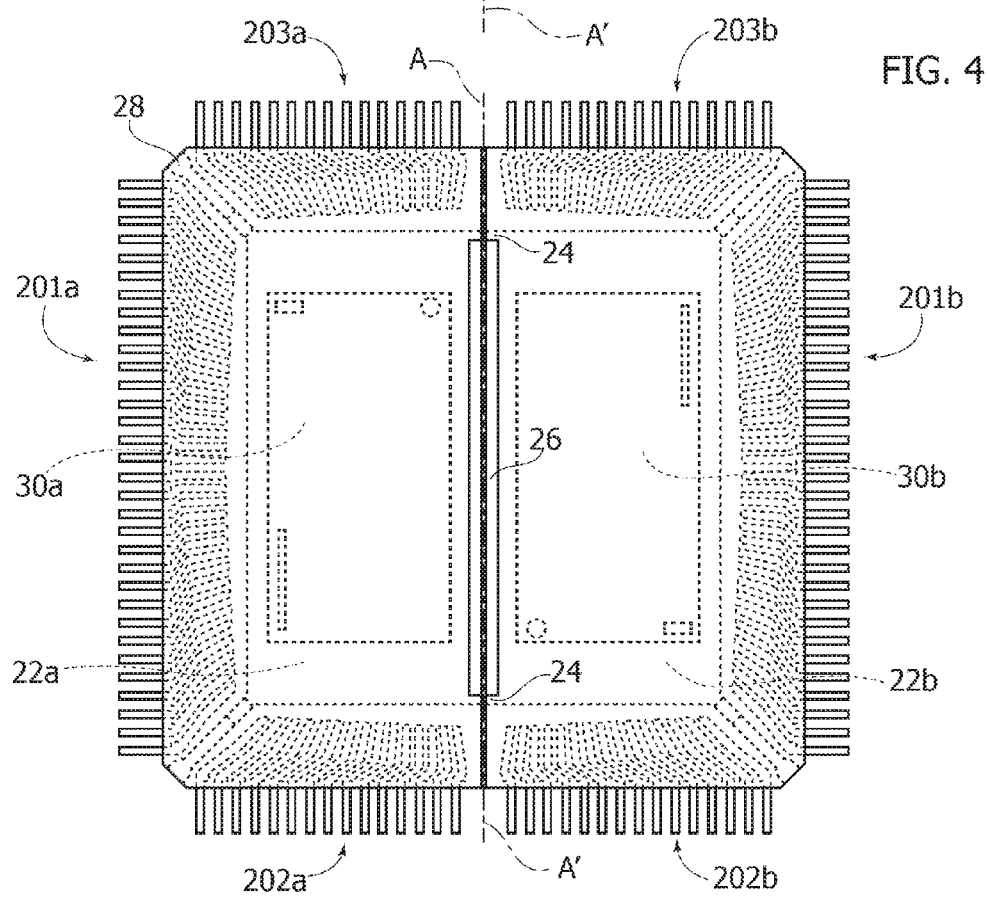

FIGS. 2 to 4 otherwise show that, in one or more embodiments, "central" leads, namely leads at regions of the lead frame 20 near the package centerline (axis A-A') may be omitted e.g. in order not to interfere with cutting as described in the following.

FIG. 3 is schematically exemplary of a die-attach process step (of any known type for that purpose) by means of which:

- a first die 30a is placed onto the left-hand die-pad island 22a.
- a second die 30b is placed onto the right-hand die-pad island 22b.

In one or more embodiments, the second die 30b may be of the same type of the first one 30a, placed onto the right-hand die-pad island 22b after being rotated by 180°.

Of course, referring to "first" and "second" dice and "left-hand" and "right-hand" islands is merely for ease of explanation: in one or more embodiments the sequence/location of placement may be reversed with respect to those exemplified.

A standard assembly flow (with no changes/modifications in equipment type) may be used up to forming of leads, which in one or more embodiments may include forming, for each portion 20a, 20b of the lead frame 20:

- a first set of leads 201a, 201b along the mutually opposed (here longer) sides of the portions 20a, 20b;
- two opposed sets of leads 202a, 202b and 203a, 203b along the two other (here shorter) sides of each portion 20a, 20b.

In one or more embodiments no leads may be formed along the mutually facing sides of the portions 20a, 20b, namely the sides defining the gap 26 therebetween.

One or more embodiments may involve molding a package molding compound 28 (of any suitable type e.g. Epoxy Molding Compound—EMC) onto the lead frame 20 and the dice 30a, 30b attached thereon (see FIG. 4).

In one or more embodiments, the assembly flow may involve a package cutting step e.g. between leads forming and package singulation.

In one or more embodiments, such cutting (e.g. laser cutting LC as schematically exemplified in FIG. 1) may occur along the centerline (axis A-A') of the package.

In one or more embodiments, such cutting may take place on the molded unit (e.g. after molding compound solidification) so that the molding compound resin along the laser path is completely removed, while only metal connections between die-pads e.g. at 24 are maintained.

These connections 24 may then be severed e.g. by mechanical action such as punching during the package singulation step, e.g. by means of dedicated punches.

One or more embodiments may thus lead to producing semiconductor devices 10 (e.g. integrated circuits or IC's) including a quadrilateral package including a first pair of opposed sides both provided with electrical contact formations (e.g. leads 202a, 202b, 203a, 203b) and a second pair of opposed sides wherein only one side in the second pair is provided with electrical contact formations (e.g. leads 201a, 201b), while the remaining side (e.g. 10a in FIGS. 1, 5 and 6) is exempt from, viz. is not provided with, any electrical contact formations, thus being lead-less. In one or more embodiments, such a leadless side may include a cut surface, e.g. a surface which is not a molded surface resulting from the molding process of the package but rather a surface produced by (e.g. laser) cutting a molded package, e.g. by cutting the molding compound (which e.g. may be detected by inspecting that surface).

Considering a laser beam of a diameter "d", and a HFP square package with sides of a length X, two rectangular "half" packages (HPG's) may then result from cutting having dimensions equal to (X/2−d/2) and X.

It will be otherwise appreciated that one or more embodiments are in no way limited in producing rectangular "half" packages by cutting a "full" square package. One or more embodiments may in fact lead e.g. to producing square "half" packages by cutting an elongate "full" rectangular package. One or more embodiments may thus involve producing quadrilateral "half" packages by cutting "full", similarly quadrilateral (that is four-sided, square or rectangular) packages.

In one or more embodiments, such a semiconductor device may be produced by:

- providing a quadrilateral lead frame (e.g. 20) including first lead frame portions (e.g. 20a, 20b) having an intermediate plane (e.g. A-A') therebetween, wherein said first and second lead frame portions include respective die pad islands (e.g. 22a, 22b) by providing sets of electrical contact leads (e.g. 201a, 202a, 202b, 201b, 203a, 203b) on all sides of said quadrilateral lead frame,
- arranging first and second semiconductor dice (e.g. 30a, 30b) on said respective die pad islands of said first and second lead frame portions,
- molding a package (e.g. 28) onto said quadrilateral lead frame having said first and second semiconductor dice arranged thereon, and
- cutting said quadrilateral lead frame having said first and second semiconductor dice arranged thereon and said package molded thereon along said intermediate plane, thereby producing (a pair of) semiconductor devices 10 as exemplified in the foregoing separated at said intermediate plane.

In one or more embodiments, said cutting may include laser cutting.

One or more embodiments may include:

- providing said quadrilateral lead frame with coupling formations (e.g. 24) extending bridge-like between said first and second lead frame portions across said intermediate plane; and
- severing (e.g. by punching) said coupling formations to separate the semiconductor devices of said pair at said intermediate plane.

In one or more embodiments, said intermediate plane may be a median plane (e.g. a centerline) of said quadrilateral lead frame, optionally with said first and second lead frame portions mirror-symmetrical with respect to said median plane.

In one or more embodiments, said first and second semiconductor dice may be identical dice, arranged rotated of 180° to each other on said respective die pad islands of said first and second lead frame portions.

Figure 5:
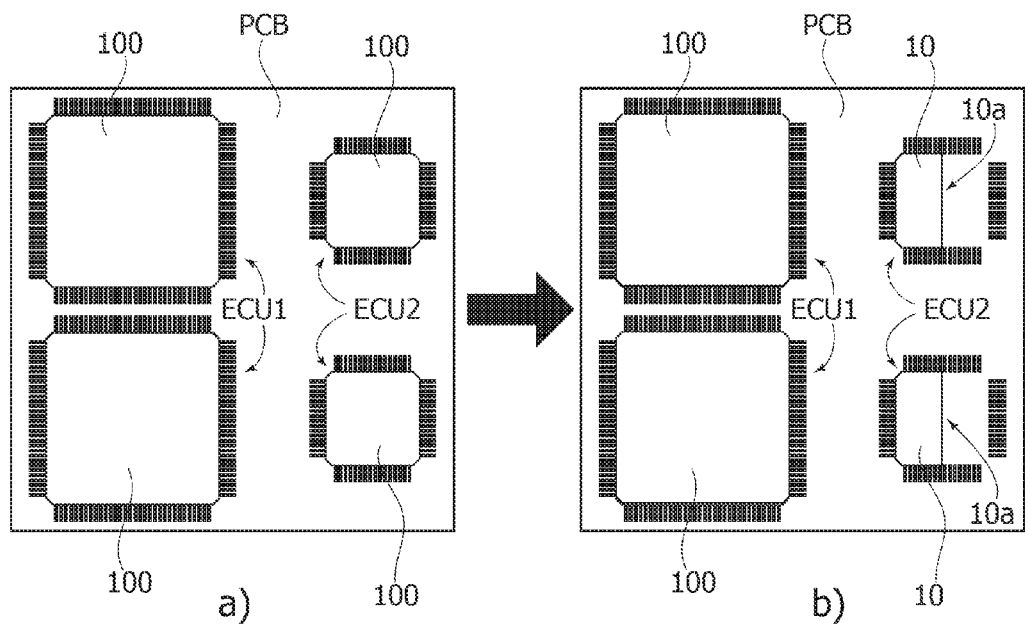
FIGS. 5 and 6, each including two portions designated a) and b), are exemplary of possible use.
Figure 6:
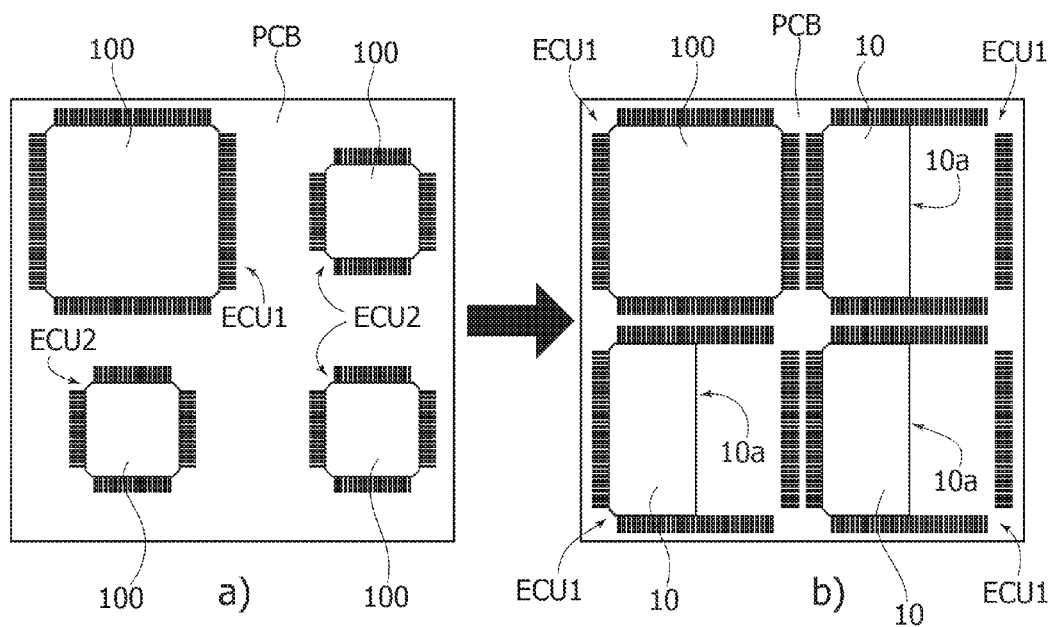

FIGS. 5 and 6 show by way of comparison the flexibility of one or more embodiments e.g. in terms of external connectivity utility (ECU) standardization.

The left hand portions, designated a), of FIGS. 5 and 6 exemplify conventional arrangements where e.g. two different versions of a certain semiconductor device (e.g. two integrated circuits providing a same function, possibly in a motor vehicle, with differences in terms of e.g. dimensions and/or number of interfaces and/or the computational power level) have been accommodated on a substrate (e.g. a printed circuit board) PCB by using two different types of (dedicated) external connectivity utility (briefly ECU), e.g. a "larger" one, ECU1 and a "smaller" one, ECU2, with "full" packages 100 (e.g. QFP), both larger and smaller mounted on the two different types of dedicated external connectivity utility.

The right hand portions, designated b), of FIGS. 5 and 6 exemplify the increased flexibility offered by one or more embodiments.

For instance, portion b) of FIG. 5, shows that the same PCB shown in portion a) and having e.g. two different types of external connectivity utility, ECU1 and ECU2, may be used to mount the larger "full" packages 100 in the larger external connectivity utilities ECU1 while the smaller external connectivity utilities ECU2 may be used to mount "half" flat packages 10 as exemplified in the foregoing, each "half" flat package 10 being a further down-sized version of the full packages 100 mounted at ECU2 in the conventional arrangements.

For instance, portion b) of FIG. 6, shows that a PCB including a single type of external connectivity utility, e.g. ECU1, may be used to mount, e.g. at one of these utilities, the larger type of "full" package 100, while the other external connectivity utilities, still of the ECU1 type, may be used to mount "half" flat packages 10, each being a "half"-sized version of the full package 100.

One or more embodiments thus make it possible to adopt one single ECU board design for different application families, with a consequent ECU cost reduction at the supplier side, possibly providing easy interchangeability of different products/packages on the same ECU board.

The right hand portions of FIGS. 5 and 6 are exemplary or one or more embodiments of a method of using semiconductor devices as exemplified in the method including:

providing a mounting substrate (e.g. PCB) provided with at least one quadrilateral external connection utility having electrical contact formations on all sides of said external connection utility: see e.g. ECU1, ECU2 all being quadrilateral (e.g. square) with four sets of electrical contact formations, one for each side of the quadrilateral shape, mounting a "half-flat" semiconductor device 10 onto said at least one quadrilateral external connection utility with the side of the semiconductor device 10 opposed to the lead-less side having its electrical contact leads (see e.g. 201a, 201b in FIG. 4) in electrical contact with the electrical contact formations on one side of said external connection utility and said first pair of opposed sides having their electrical contact leads (see e.g. 202a, 202b, 203a, 203b in FIG. 4) in electrical contact with electrical contact formations provided on two other sides of said external connection utility.

The right hand portions of FIGS. 5 and 6 are also exemplary of electronic apparatus (e.g. a processor or controller for use e.g. in a motor vehicle):

a mounting substrate provided with at least one quadrilateral external connection utility (e.g. ECU1, ECU2) having electrical contact formations on all sides of said external connection utility, a semiconductor device 10 as exemplified in the foregoing mounted on said at least one quadrilateral external connection utility (e.g. ECU1 or ECU2) with the side of the semiconductor device opposed to the lead-less side having its electrical contact leads (see e.g. 201a, 201b in FIG. 4) in electrical contact with the electrical contact formations on one side of said external connection utility and said first pair of opposed sides having their electrical contact leads (see e.g. 202a, 202b, 203a, 203b in FIG. 4) in electrical contact with electrical contact formations provided on two other sides of said external connection utility.

The right hand portions of FIGS. 5 and 6 are also similarly exemplary of electronic apparatus (e.g. as considered in the foregoing) wherein the mounting substrate (e.g. PCB) is provided with at least one further quadrilateral external connection utility having electrical contact formations on all sides of said external connection utility (ECU1) with a further "full" semiconductor device 100 (that is having electrical contact leads on all its sides) in electrical contact with the electrical contact formations on all sides of said further external connection utility: see e.g. the two semiconductor devices 100 on the left side of portion b) of FIG. 5 or the semiconductor device 100 on the upper left corner of portion b) of FIG. 6.

Without prejudice to the underlying principles, the details and embodiments may vary, even significantly, with respect to what has been described by way of example only without departing from the extent of protection.

The extent of protection is defined by the annexed claims.

The invention claimed is:

1. A semiconductor device, comprising:
a quadrilateral package including a first side and a second side, wherein the first and second sides are opposed sides and are both provided with electrical contact leads and further including a third side and a fourth side, wherein the third and fourth sides are opposed sides and wherein the third side is provided with electrical contact leads, and wherein the fourth side is a leadless side, and wherein said first through third sides are molded sides of the quadrilateral package and said fourth side is a non-molded side of the quadrilateral package defined by a cut surface.

2. The semiconductor device of claim 1, further comprising a leadframe encapsulated within the quadrilateral package, said leadframe including, at said fourth side a gap in the leadframe longitudinally extending parallel to the fourth side.

3. The semiconductor device of claim 2, wherein said leadframe further comprises, at opposite ends of the gap, a bridge connector portion severed by the cut surface.

4. A semiconductor device, comprising:
a mounting substrate including leads,
a semiconductor device mounted to the mounting substrate, said semiconductor device comprising a first side, a second side, a third side and a fourth side, wherein the first, second and third sides of the semiconductor device include electrical contacts electrically connected to the leads of the mounting substrate, and wherein the fourth side does not include electrical contacts,
a package encapsulating the mounting substrate and the semiconductor device, wherein said package has a quadrilateral shape formed by first, second, third and fourth package sides,
wherein said leads extend from the first, second and third package sides, and
wherein the first, second and third package sides are molded sides of the package and said fourth side is a non-molded side of the package defined by a cut surface.

5. The semiconductor device of claim 4, wherein the mounting substrate includes a leadframe.

6. The semiconductor device of claim 5, wherein said leadframe includes, at said fourth package side a gap in the leadframe longitudinally extending parallel to the fourth package side.

7. The semiconductor device of claim 6, wherein said cut surface exposes bridge connector portions of the leadframe.

8. The semiconductor device of claim 4, wherein said cut surface is a laser cut surface.

9. A semiconductor device, comprising:
a mounting substrate including leads,
a semiconductor device mounted to the mounting substrate, said semiconductor device comprising electrical contacts electrically connected to the leads of the mounting substrate,
a package encapsulating the mounting substrate and the semiconductor device, wherein said package has a quadrilateral shape formed by first, second, third and fourth package sides,
wherein said leads extend from the first, second and third package sides but not from the fourth package side, and
wherein the first, second and third package sides are molded sides of the package and said fourth side is a non-molded side of the package defined by a cut surface.

10. The semiconductor device of claim 9, wherein the mounting substrate includes a leadframe.

11. The semiconductor device of claim 10, wherein said leadframe includes, at said fourth package side a gap in the leadframe longitudinally extending parallel to the fourth package side.

12. The semiconductor device of claim 11, wherein said cut surface exposes bridge connector portions of the leadframe.

13. The semiconductor device of claim 9, wherein said cut surface is a laser cut surface.

* * * * *